United States Patent
Shih et al.

(10) Patent No.: US 11,050,440 B2
(45) Date of Patent: Jun. 29, 2021

(54) ENCODER, DECODER, ENCODING METHOD AND DECODING METHOD BASED ON LOW-DENSITY PARITY-CHECK CODE

(71) Applicant: MACRONIX INTERNATIONAL CO., LTD., Hsinchu (TW)

(72) Inventors: Chih-Huai Shih, Taichung (TW); Yu-Ming Huang, Taipei (TW); Hsiang-Pang Li, Zhubei (TW); Hsi-Chia Chang, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 2 days.

(21) Appl. No.: 16/658,191

(22) Filed: Oct. 21, 2019

(65) Prior Publication Data

US 2021/0119645 A1    Apr. 22, 2021

(51) Int. Cl.
| | |
|---|---|
| *H03M 13/00* | (2006.01) |
| *H03M 13/25* | (2006.01) |
| *H03M 13/15* | (2006.01) |
| *H03M 13/29* | (2006.01) |
| *H03M 13/11* | (2006.01) |

(52) U.S. Cl.
CPC ..... *H03M 13/255* (2013.01); *H03M 13/1102* (2013.01); *H03M 13/152* (2013.01); *H03M 13/2903* (2013.01)

(58) Field of Classification Search
None
See application file for complete search history.

(56) References Cited

U.S. PATENT DOCUMENTS

| | | | |
|---|---|---|---|
| 2015/0254136 A1* | 9/2015 | Hoya | G06F 11/1012 714/764 |
| 2017/0214415 A1* | 7/2017 | Kokubun | G06F 11/1068 |
| 2017/0249210 A1* | 8/2017 | Oyamatsu | G06F 11/1068 |
| 2019/0140668 A1* | 5/2019 | Kim | H03M 13/35 |
| 2020/0244286 A1* | 7/2020 | Kubo | H03M 13/3723 |

OTHER PUBLICATIONS

J. Dore, M. Hamon and P. Penard, "A Structured LDPC Code Construction for Efficient Encoder Design," 2006 IEEE International Conference on Communications, Istanbul, Turkey, 2006, pp. 1680-1685, doi: 10.1109/ICC.2006.254961. (Year: 2006).*

* cited by examiner

*Primary Examiner* — Daniel F. McMahon
(74) *Attorney, Agent, or Firm* — McClure, Qualey & Rodack, LLP

(57) ABSTRACT

An encoding method includes: receiving, by an encoder, an information for encoding; generating, by the encoder, a first portion codeword according to a first encoding rule and the information for encoding, wherein the first encoding rule is an encoding rule configured to generate LDPC code; generating, by the encoder, a second portion codeword according to a second encoding rule different from the first encoding rule and a double check region of the first portion codeword; and concatenating, by the encoder, the first portion codeword and the second portion codeword to generate a codeword. A plurality of trapping sets corresponding to the first encoding rule include at least one error bit within the double check region.

20 Claims, 4 Drawing Sheets

ENCODER, DECODER, ENCODING METHOD AND DECODING METHOD BASED ON LOW-DENSITY PARITY-CHECK CODE

BACKGROUND OF THE INVENTION

Field of the Invention

The invention relates to an encoder, a decoder, an encoding method and a decoding method based on Low-Density Parity-Check (LDPC) code.

Description of the Related Art

Low-Density Parity-Check (LDPC) code is a linear error correction code (ECC), which is widely used in error correction mechanisms of communication systems and memory devices. However, although the ability of error correction of LDPC code outperforms algebraic code, the ability of error correction of LDPC code is not good enough in cases that the raw bit error rate is extremely low.

SUMMARY OF THE INVENTION

An embodiment of the present invention discloses an encoder based on Low-Density Parity-Check (LDPC) code comprises a first encoding unit, a second encoding unit and a concatenation unit. The first encoding unit is configured to receive an information for encoding, and generate a first portion codeword according to a first encoding rule and the information for encoding, wherein the first encoding rule is an encoding rule configured to generate LDPC code. The second encoding unit is coupled to the first encoding unit, and is configured to receive the first portion codeword, and generate a second portion codeword according to a second encoding rule different from the first encoding rule and a double check region of the first portion codeword. The concatenation unit is coupled to the first encoding unit and the second encoding unit, and is configured to concatenate the first portion codeword and the second portion codeword to generate a codeword. A plurality of trapping sets corresponding to the first encoding rule include at least one error bit within the double check region.

An embodiment of the present invention discloses a decoder based on Low-Density Parity-Check (LDPC) code comprises a first decoding unit and a second decoding unit. The first decoding unit is configured to receive a codeword, extract a first portion codeword of the codeword, and decode the first portion codeword according to a first decoding rule, wherein the first decoding rule is a decoding rule configured to decode LDPC code. The second decoding unit is coupled to the first decoding unit, and is configured to receive the codeword processed by the first decoding unit when the first decoding unit fails to decode the first portion codeword, extract a second portion codeword of the codeword, decode the second portion codeword according to a second decoding rule different from the first decoding rule, correct a double check region of the first portion codeword according to a result of decoding the second portion codeword, and transmit the first portion codeword which includes the correct double check region for decoding again. A plurality of trapping sets corresponding to the first decoding rule include at least one error bit within the double check region.

An embodiment of the present invention discloses an encoding method based on Low-Density Parity-Check (LDPC) code comprises: receiving, by an encoder, an information for encoding; generating, by the encoder, a first portion codeword according to a first encoding rule and the information for encoding, wherein the first encoding rule is an encoding rule configured to generate LDPC code; generating, by the encoder, a second portion codeword according to a second encoding rule different from the first encoding rule and a double check region of the first portion codeword; and concatenating, by the encoder, the first portion codeword and the second portion codeword to generate a codeword. A plurality of trapping sets corresponding to the first encoding rule include at least one error bit within the double check region.

An embodiment of the present invention discloses a decoding method based on Low-Density Parity-Check (LDPC) code comprises: receiving, by a decoder, a codeword; extracting, by the decoder, a first portion codeword of the codeword, and decoding the first portion codeword according to a first decoding rule, wherein the first decoding rule is a decoding rule configured to decode LDPC code; determining, by the decoder, whether the decoding is success; when decoding fails, extracting, by the decoder, a second portion codeword of the codeword, and decoding the second portion codeword according to a second decoding rule different from the first decoding rule; correcting, by the decoder, a double check region of the first portion codeword according to a result of decoding the second portion codeword, and decoding, by the decoder, the first portion codeword which includes the corrected double check region. A plurality of trapping sets corresponding to the first decoding rule include at least one error bit within the double check region.

The above and other aspects of the invention will become better understood with regard to the following detailed description of the preferred but non-limiting embodiment(s). The following description is made with reference to the accompanying drawings.

DETAILED DESCRIPTION OF THE INVENTION

Figures 1, 2:
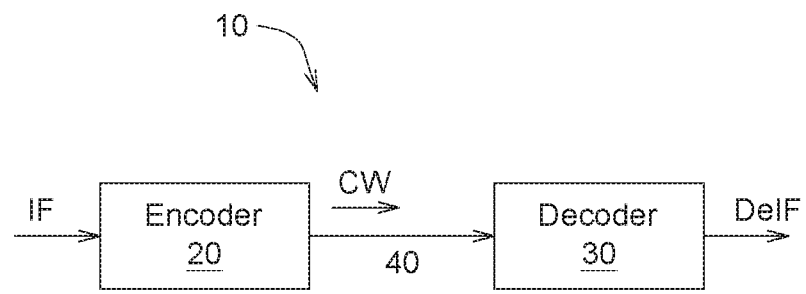
FIG. 1 shows a block diagram of an encoding/decoding system based on LDPC code according to an embodiment of the present invention.
FIG. 2 shows a schematic diagram of trapping sets of a LDPC code.

Referring to FIG. 1, FIG. 1 shows a block diagram of an encoding/decoding system based on Low-Density Parity-Check (LDPC) code according to an embodiment of the present invention. Encoding/decoding system 10 includes an encoder 20 and a decoder 30. The encoder 20 is configured to encode an information for encoding IF into a codeword according to an encoding algorithm based on LDPC code, and transmit the codeword to the decoder 30 via a channel 40. The decoder 30 is configured to decode the codeword to a decoded information DeIF according to a decoding algorithm based on LDPC code. Details of the encoder 20, the decoder 30, the encoding algorithm and the decoding algorithm may be described below.

Before the details of the encoder 20, the decoder 30, the encoding algorithm and the decoding algorithm being described, a problem encountered by the LDPC code may be explained firstly. Refers to a schematic diagram of trapping sets of a LDPC code shown in FIG. 2. Codewords generated based on a specific LDPC encoding rule may have error bits for various reason during transmission through the channel and when the decoder is receiving. Some of these codewords having error bits (hereafter, error pattern) may be corrected by the decoder during iterations and the correct information may be obtained, but some of the error patterns may not be corrected by the decoder during iterations due to the mechanism of LDPC code so that the correct information may not be obtained. A set formed by these an error pattern which cannot be corrected is called a trapping set corresponding to the specific LDPC encoding rule. That is, in conventional LDPC code, the error patterns of the trapping set may not be corrected by a LDPC decoder. This may lead to the difficulty of improving the error correction ability of conventional LDPC code in a case that the raw bit error rate (RBER) is extremely low. In the example of FIG. 2, an encoded codeword includes ten bits. The corresponding trapping sets include TP1~TP5, wherein correct bits are represented by white circles, and error bits are represented by black circles.

Figure 3:
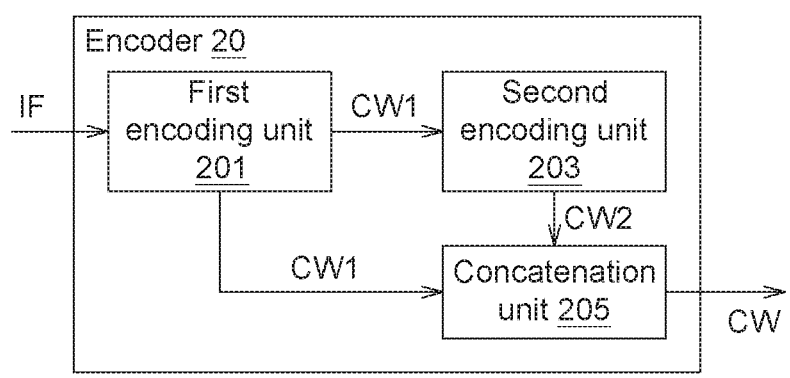
FIG. 3 shows a block diagram of an encoder based on LDPC code according to an embodiment of the present invention.

Referring to FIG. 3, FIG. 3 shows a block diagram of an encoder based on LDPC code according to an embodiment of the present invention. The encoder 20 includes a first encoding unit 201, a second encoding unit 203 and a concatenation unit 205.

The first encoding unit 201 is configured to receive the information for encoding IF, and generate a first portion codeword CW1 according to a first encoding rule and the information for encoding, wherein the first encoding rule is an encoding rule configured to generate a LDPC code. In other words, the first portion codeword CW1 by the first encoding unit 201 by encoding the information for encoding IF is a LDPC codeword. Noted that the encoding rule of LDPC code is well known by the skilled person in the art, and may not be describe herein.

The second encoding unit 203 is coupled to the first encoding unit 203, is configured to receive the first portion codeword CW1, and generate a second portion codeword CW2 according to a second encoding rule and a double check region of the first portion codeword CW1, wherein the second encoding rule is different from the first encoding rule. For example, the second encoding rule may be a encoding rule configured to generate a Bose Chaudhur Hocquenghem (BCH) code. In other embodiments, the second encoding rule may be an encoding rule for generating Cyclic redundancy check (CRC), check sum, Reed-solomon code (RS-code) or Turbo code. The "double check region" refers to a section consisting of partial bits of the first portion codeword CW1. The bits which make up the double check region may be continuous or discontinuous. The double check region is determined according to a trapping set corresponding to the first encoding rule, and each of the trapping sets corresponding to the first encoding rule includes at least one error bit within the double check region. A length of the double check region is less than a length of the first portion codeword CW1.

For clearly understanding of how to determine the double check region, the example of FIG. 2 may be taken for illustration. It is assumed that the trapping set corresponding to the first encoding rule is the trapping set shown in FIG. 2. In an embodiment, the double check region may be determined as from the 8th bit to the 10th bit of the first portion codeword CW1, that is, three continuous bits. It can be observed in the trapping set shown in FIG. 2 that, the trapping set TP1 has an error bit within the double check region, the trapping set TP2 has an error bit within the double check region, the trapping set TP3 has an error bit within the double check region, the trapping set TP4 has two error bits within the double check region, and the trapping set TP5 has an error bit within the double check region, that is the condition for determining the double check region is met. In another embodiment, the double check region may be determined as the combination of the 2nd bit and the 8th bit of the first portion codeword CW1, that is, two discontinuous bits. It can be observed in the trapping set shown in FIG. 2 that, the trapping set TP1 has an error bit within the double check region, the trapping set TP2 has an error bit within the double check region, the trapping set TP3 has an error bit within the double check region, the trapping set TP4 has two error bits within the double check region, and the trapping set TP5 has an error bit within the double check region, that is the condition for determining the double check region is met.

It should be noted that after the first encoding rule is determined by an encoding designer, the trapping set corresponding to the first encoding rule may be obtained by analyzing possible error patterns of the first portion codeword CW1, and then the double check region may be determined by analyzing the trapping set. Therefore, the double check region may be pre-set in the second encoding unit 203.

The concatenation unit 205 is coupled to the first encoding unit 201 and the second encoding unit 203, and is configured to concatenate the first portion codeword CW1 and the second portion codeword CW2 to generate the codeword CW. In an embodiment, the concatenation unit 205 concatenates the second portion codeword CW2 to the end of the first portion codeword CW1 to generate the codeword CW. In another embodiment, the concatenation unit 205 concatenates the first portion codeword CW1 to the end of the second portion codeword CW2 to generate the codeword CW. In yet another embodiment, the concatenation unit 205 inserts the second portion codeword CW2 into the first portion codeword CW1 to generate the codeword CW.

Figure 4:
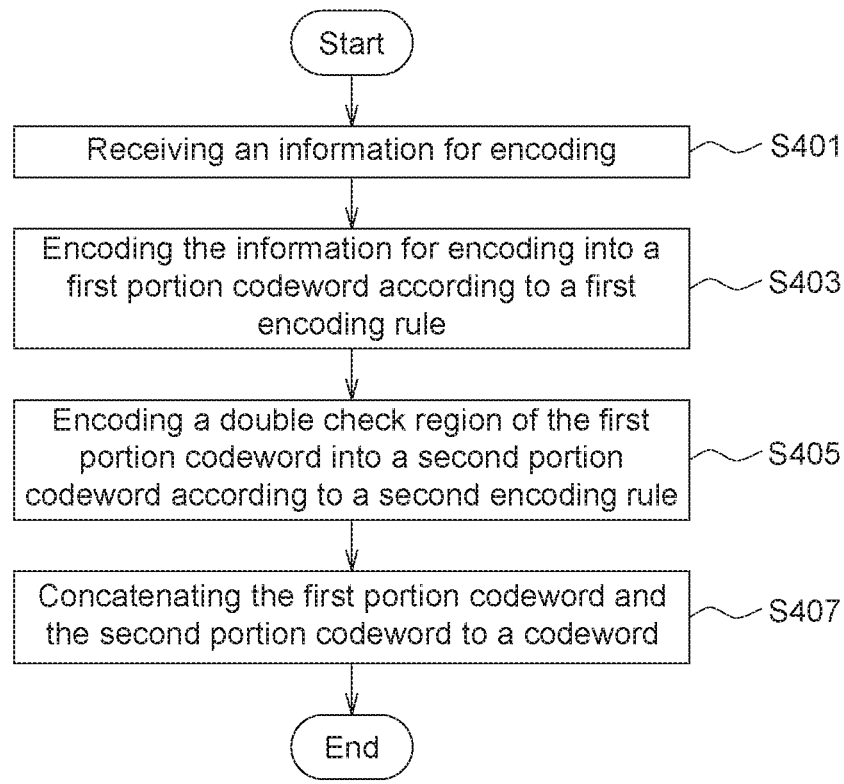
FIG. 4 shows a flowchart of an encoding method based on LDPC code according to an embodiment of the present invention.
Figure 5:
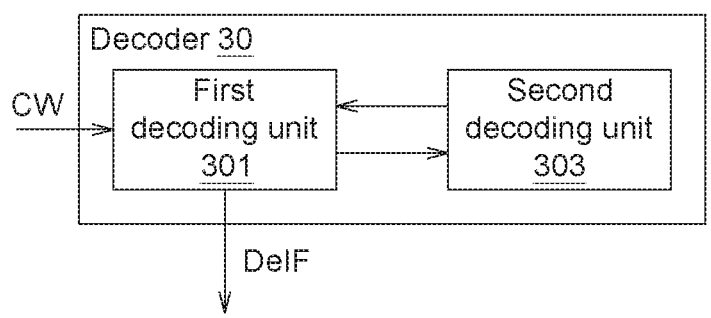
FIG. 5 shows a block diagram of a decoder based on LDPC code according to an embodiment of the present invention.

Referring to FIG. 4, FIG. 4 shows a flowchart of an encoding method based on LDPC code according to an embodiment of the present invention. FIG. 4 depicts the encoding algorithm used by the encoder 20 as a flowchart for ease of understanding.

In S401, receives an information for encoding.

In S403, encodes the information for encoding into a first portion codeword according to a first encoding rule, wherein the first encoding rule is an encoding rule of LDPC code.

In S405, encodes a double check region of the first portion codeword into a second portion codeword according to a second encoding rule, wherein the second encoding rule is different from the first encoding rule.

In S407, concatenates the first portion codeword and the second portion codeword to a codeword.

The codeword CW is transmitted via the channel 40 and received by the decoder 30. Details of the decoder 30 may be illustrated below.

The decoder 30 includes a first decoding unit 301 and a second decoding unit 303. The first decoding unit 301 is configured to extract the first portion codeword CW1 of the codeword CW, and decode the first portion codeword CW1 according to a first decoding rule corresponding to the first encoding rule. Since the codeword CW may have some error bits after being transmitted through the channel 40 due to the effect of noise. When the first portion codeword CW1 is not able to be decoded by the first decoding unit 301, decoding fail may be determined. When the first portion codeword CW1 is decoded by the first decoding unit 301 successfully, decoding succeed may be determined, and the decoded first portion codeword CW1 may be output as the decoded information DeIF. In an embodiment, although decoding fail is determined, the first decoding unit 301 still can correct partial error bits of the first portion codeword CW1 during the decoding process. The error pattern formed by the rest error bits which cannot be corrected may probably belong to the trapping sets. After decoding fail is determined, the first decoding unit 301 may transmit the codeword CW which includes the preliminarily corrected first portion codeword CW1 to the second decoding unit 303.

The second decoding unit is coupled to the first decoding unit 301, and is configured to receive the codeword CW which includes the preliminarily corrected first portion codeword CW1 from the first decoding unit 301, extract the second portion codeword CW2 of the codeword CW, decode the second portion codeword CW2 according to a second decoding rule corresponding to the second encoding rule, and correct the double check region of the first portion codeword CW1 according to a result obtain by decoding the second portion codeword CW2. When it is observed, by decoding the second portion codeword, that the double check region includes error bit(s), the second decoding unit 303 may locate the error bit(s) in the double check region and correct it according to the result obtained by decoding the second portion codeword CW2. When it is observed, by decoding the second portion codeword, that the double check region includes no error bit, the second decoding unit 303 may not modify the double check region. Since each of the trapping sets includes at least one error bit within the double check region, therefore if the error pattern of the preliminarily corrected first portion codeword belongs to the trapping sets, the second decoding unit 303 can correct the error bit(s) within the double check region, and then the first portion codeword CW1 which is corrected by the second decoding unit 303 may no longer belong to the trapping sets.

The codeword CW processed by the second decoding unit 303 may be transmitted to the first decoding unit 301. The first decoding unit 301 is configured to extract the first portion codeword CW1 processed by the second decoding unit 303, and decode the first portion codeword CW1 according to the first decoding rule. Since the first portion codeword CW1 processed by the second decoding unit 303 does not belong to the trapping set anymore, the first decoding unit 301 may probably be able to decode the first portion codeword CW1 successfully, and output the decoded first portion codeword as the decoded information DeIF. If the first decoding unit 301 still cannot decode the first portion codeword CW1, decoding fail confirmed may be determined and end the decoding process. Noted that, the trapping sets obtained by analyzing do not guarantee all the error pattern which causes the first decoding unit 301 to be not able to decode the first portion codeword CW1 successfully are included, the error pattern of the first portion codeword CW1 processed by the second decoding unit 303 may be an unknown trapping set to cause decoding fail confirmed. Even so, the encoder and the decoder described above may still solve the problem that the first portion codeword cannot be decoded successfully caused by the known trapping set obtained by analyzing, and increase the probability of error correction.

Figure 6:
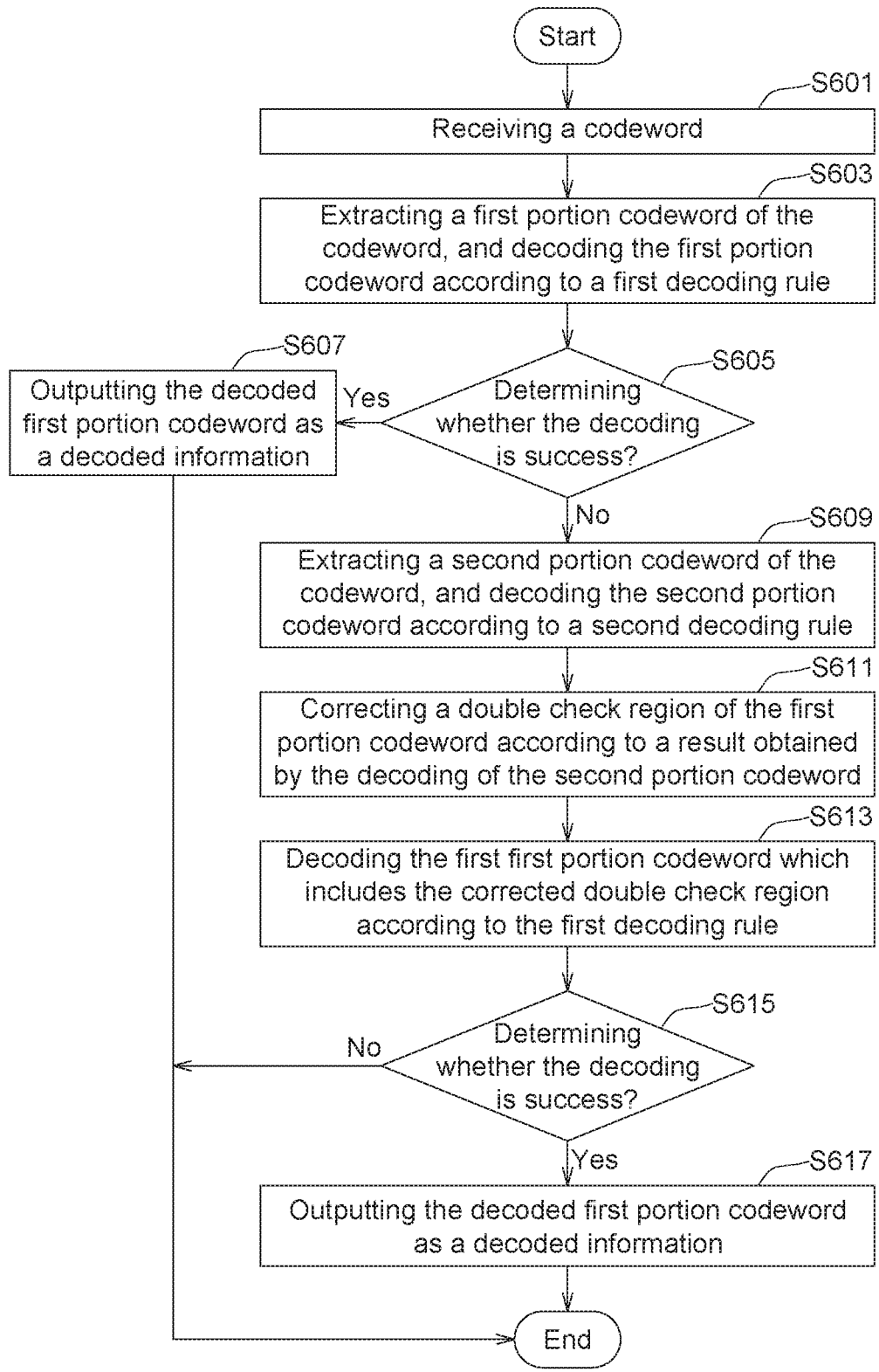
FIG. 6 shows a flowchart of a decoding method based on LDPC code according to an embodiment of the present invention.

Referring to FIG. 6, FIG. 6 shows a flowchart of a decoding method based on LDPC code according to an embodiment of the present invention. FIG. 4 depicts the decoding algorithm used by the decoder 30 as a flowchart for ease of understanding.

In S601, receive a codeword.

In S603, extract a first portion codeword of the codeword, and decode the first portion codeword according to a first decoding rule.

In S605, determine whether the decoding is success. If decoding is success, S607 is performed; if decoding is not success, S609 is performed.

In S607, output the decoded first portion codeword as a decoded information.

In S609, extract a second portion codeword of the codeword, and decode the second portion codeword according to a second decoding rule.

In S611, correct a double check region of the first portion codeword according to a result obtained by the decoding of the second portion codeword.

In S613, decode the first portion codeword which includes the corrected double check region according to the first decoding rule.

In S615, determine whether the decoding is success. If decoding is success, S617 is performed; if decoding is not success, end the decoding process.

In S617, output the decoded first portion codeword as a decoded information.

The present invention provides a second layer of protection for the correctness of the double check region, by the encoder, by generating the second portion codeword based on the double check region of the first portion codeword (LDPC code). When the first decoding unit (for decoding LDPC code) of the decoder is not able to decode the first portion codeword, the decoder may use the second decoding unit to check the correctness of the double check region based on the second portion codeword and then correct the error bit(s) of the double check region. While the error bit(s) of the double check region has been corrected, the first decoding unit may probably be able to correct other errors of the first portion codeword like a domino, and decode successfully. Therefore, the present invention can effectively reduce the case of decoding fail caused by the trapping set and improve the error correction ability of the overall encoding/decoding system with a small increase in cost.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An encoder based on Low-Density Parity-Check (LDPC) code, comprising:
 a first encoding unit, configured to receive an information for encoding, and generate a first portion codeword according to a first encoding rule and the information for encoding, wherein the first encoding rule is an encoding rule configured to generate LDPC code;

a second encoding unit, coupled to the first encoding unit, and configured to receive the first portion codeword, and generate a second portion codeword according to a second encoding rule different from the first encoding rule and a double check region of the first portion codeword; and a concatenation unit, coupled to the first encoding unit and the second encoding unit, and configured to concatenate the first portion codeword and the second portion codeword to generate a codeword, wherein a plurality of trapping sets corresponding to the first encoding rule include at least one error bit within the double check region.

2. The encoder according to claim 1, wherein the second encoding rule is an encoding rule configured to generate Bose-Chaudhuri-Hocquenghem code.

3. The encoder according to claim 1, wherein the double check region includes a plurality of continuous bits of the first portion codeword.

4. The encoder according to claim 1, wherein the double check region includes a plurality of discontinuous bits of the first portion codeword.

5. The encoder according to claim 1, wherein a length of the double check region is less than a length of the first portion codeword.

6. A decoder based on Low-Density Parity-Check (LDPC) code, comprising:

a first decoding unit, configured to receive a codeword, extract a first portion codeword of the codeword, and decode the first portion codeword according to a first decoding rule, wherein the first decoding rule is a decoding rule configured to decode LDPC code; and a second decoding unit, coupled to the first decoding unit, and configured to receive the codeword processed by the first decoding unit when the first decoding unit fails to decode the first portion codeword, extract a second portion codeword of the codeword, decode the second portion codeword according to a second decoding rule different from the first decoding rule, correct a double check region of the first portion codeword according to a result of decoding the second portion codeword, and transmit the first portion codeword which includes the corrected double check region for the first decoding unit to decode the first portion codeword which includes the corrected double check region, wherein a plurality of trapping sets corresponding to the first decoding rule include at least one error bit within the double check region.

7. The decoder according to claim 6, wherein the second decoding rule is a decoding rule configured to decode Bose-Chaudhuri-Hocquenghem code.

8. The encoder according to claim 6, wherein the double check region includes a plurality of continuous bits of the first portion codeword.

9. The decoder according to claim 6, wherein the double check region includes a plurality of discontinuous bits of the first portion codeword.

10. The decoder according to claim 6, wherein a length of the double check region is less than a length of the first portion codeword.

11. An encoding method based on Low-Density Parity-Check (LDPC) code, comprising:

receiving, by an encoder, an information for encoding;

generating, by the encoder, a first portion codeword according to a first encoding rule and the information for encoding, wherein the first encoding rule is an encoding rule configured to generate LDPC code;

generating, by the encoder, a second portion codeword according to a second encoding rule different from the first encoding rule and a double check region of the first portion codeword; and concatenating, by the encoder, the first portion codeword and the second portion codeword to generate a codeword, wherein a plurality of trapping sets corresponding to the first encoding rule include at least one error bit within the double check region.

12. The encoding method according to claim 11, wherein the second encoding rule is an encoding rule configured to generate Bose-Chaudhuri-Hocquenghem code.

13. The encoding method according to claim 11, wherein the double check region includes a plurality of continuous bits of the first portion codeword.

14. The encoding method according to claim 11, wherein the double check region includes a plurality of discontinuous bits of the first portion codeword.

15. The encoding method according to claim 11, wherein a length of the double check region is less than a length of the first portion codeword.

16. A decoding method based on Low-Density Parity-Check (LDPC) code, comprising:

receiving, by a decoder, a codeword;

extracting, by the decoder, a first portion codeword of the codeword, and decoding the first portion codeword according to a first decoding rule, wherein the first decoding rule is a decoding rule configured to decode LDPC code;

determining, by the decoder, whether the decoding is success;

when decoding fails, extracting, by the decoder, a second portion codeword of the codeword, and decoding the second portion codeword according to a second decoding rule different from the first decoding rule;

correcting, by the decoder, a double check region of the first portion codeword according to a result of decoding the second portion codeword, and decoding, by the decoder, the first portion codeword which includes the corrected double check region, wherein a plurality of trapping sets corresponding to the first decoding rule include at least one error bit within the double check region.

17. The decoding method according to claim 16, wherein the second decoding rule is a decoding rule configured to decode Bose-Chaudhuri-Hocquenghem code.

18. The decoding method according to claim 16, wherein the double check region includes a plurality of continuous bits of the first portion codeword.

19. The decoding method according to claim 16, wherein the double check region includes a plurality of discontinuous bits of the first portion codeword.

20. The decoding method according to claim 16, wherein a length of the double check region is less than a length of the first portion codeword.

* * * * *